United States Patent [19]
Lin et al.

[11] Patent Number: 6,088,461
[45] Date of Patent: Jul. 11, 2000

[54] DYNAMIC VOLUME CONTROL SYSTEM

[75] Inventors: Kun Lin; Jonathan Mayer; James Martin Nohrden, all of Austin, Tex.

[73] Assignee: Crystal Semiconductor Corporation, Austin, Tex.

[21] Appl. No.: 08/938,046

[22] Filed: Sep. 26, 1997

[51] Int. Cl.[7] .................................................. H03G 3/00
[52] U.S. Cl. .......................... 381/104; 381/107; 381/109
[58] Field of Search .................................. 381/104, 102, 381/103, 106, 107, 109, 119; 341/139; 455/218, 219

[56] References Cited

U.S. PATENT DOCUMENTS

| | | | |
|---|---|---|---|
| Re. 33,739 | 11/1991 | Takashima et al. | 84/603 |
| 3,555,192 | 1/1971 | Hymer . | |
| 3,605,042 | 9/1971 | Rapp . | |
| 3,681,704 | 8/1972 | Davidson | 333/28 T |
| 3,725,583 | 4/1973 | Gunderson et al. . | |
| 3,769,459 | 10/1973 | Niffenegger et al. . | |
| 4,076,959 | 2/1978 | Gilbert et al. . | |
| 4,214,501 | 7/1980 | von Kemenczky . | |
| 4,489,439 | 12/1984 | Scholz et al. | 381/63 |
| 4,509,191 | 4/1985 | Miller | 381/63 |
| 4,528,696 | 7/1985 | Martin, III | 455/73 |
| 4,584,700 | 4/1986 | Scholz | 381/61 |
| 4,584,921 | 4/1986 | Wachi . | |
| 4,649,786 | 3/1987 | Niinomi et al. . | |
| 4,731,835 | 3/1988 | Futamase et al. | 381/63 |
| 4,748,669 | 5/1988 | Klayman | 381/1 |
| 4,752,960 | 6/1988 | Scholz | 381/61 |
| 4,817,149 | 3/1989 | Myers | 381/1 |
| 4,841,572 | 6/1989 | Klayman | 381/17 |
| 4,864,246 | 9/1989 | Kato et al. | 381/107 |
| 4,866,774 | 9/1989 | Klayman | 381/1 |
| 4,909,119 | 3/1990 | Morokuma | 84/DIG. 26 |
| 4,942,799 | 7/1990 | Suzuki | 84/603 |
| 4,955,057 | 9/1990 | Tominari | 381/63 |
| 4,993,073 | 2/1991 | Sparkes | 381/119 |
| 5,012,199 | 4/1991 | McKale | 330/51 |
| 5,046,107 | 9/1991 | Iwamatsu | 381/109 |
| 5,123,050 | 6/1992 | Serikawa et al. | 381/61 |
| 5,130,665 | 7/1992 | Walden | 381/104 |
| 5,140,886 | 8/1992 | Masaki et al. | 84/607 |
| 5,179,238 | 1/1993 | Hotta | 84/478 |
| 5,189,705 | 2/1993 | Lavaud | 381/109 |
| 5,201,005 | 4/1993 | Matsushita et al. | 381/63 |
| 5,263,092 | 11/1993 | Jang | 381/104 |
| 5,300,723 | 4/1994 | Ito | 84/601 |
| 5,317,104 | 5/1994 | Frost | 84/625 |
| 5,323,275 | 6/1994 | Himeno et al. | 381/107 |
| 5,333,203 | 7/1994 | Diaz | 381/63 |
| 5,342,990 | 8/1994 | Rossum | 84/603 |
| 5,365,195 | 11/1994 | Kageyama | 330/284 |
| 5,369,711 | 11/1994 | Williamson, III | 381/104 |
| 5,371,803 | 12/1994 | Williamson, III | 381/104 |

(List continued on next page.)

FOREIGN PATENT DOCUMENTS

| | | | |
|---|---|---|---|
| 0178840A | 4/1986 | European Pat. Off. . | |
| 0568789A | 11/1993 | European Pat. Off. . | |
| 2054994 | 2/1981 | United Kingdom | 381/109 |
| WO9534883A | 12/1995 | WIPO . | |

*Primary Examiner*—Forester W. Isen
*Assistant Examiner*—Xu Mei
*Attorney, Agent, or Firm*—Skjerven, Morrill, MacPherson, Franklin & Friel, LLP; Peter Rutowski; Ken J. Koestner

[57] ABSTRACT

A dynamic volume control system in an audio processor uses gain and delay signals from a digital signal processor to dynamically control the user-selected volume of the audio processor. The digital signal processor executes audio signal processing operations that affect the gain applied to the audio signal so that the signal gain inherent in the signal processing path is known. The digital signal processor transfers the known gain and a predicted group delay signal to the dynamic volume control system to dynamically adjust the user-selected volume of the system. The digital signal processor is integrated with a digital-to-analog converter (DAC) in a dynamic volume control system that exploits the known gain and group delay to perform DAC volume control.

42 Claims, 11 Drawing Sheets

(One Channel of Volume Control)

U.S. PATENT DOCUMENTS

| | | | |
|---|---|---|---|
| 5,384,856 | 1/1995 | Kyouno et al. | 381/103 |
| 5,394,476 | 2/1995 | Rollins et al. | 381/104 |
| 5,400,410 | 3/1995 | Muraki et al. | 381/107 |
| 5,410,265 | 4/1995 | Jain et al. | 381/109 |
| 5,491,755 | 2/1996 | Vogt et al. | 381/86 |
| 5,555,306 | 9/1996 | Gerzon | 381/63 |
| 5,567,901 | 10/1996 | Gibson et al. | 84/603 |
| 5,596,651 | 1/1997 | Yamaguchi | 381/104 |
| 5,621,801 | 4/1997 | Kunimoto et al. | 381/63 |
| 5,633,939 | 5/1997 | Kitani et al. | 381/106 |
| 5,644,098 | 7/1997 | Jenkins et al. | 84/624 |
| 5,652,800 | 7/1997 | Roberts | 381/119 |
| 5,665,929 | 9/1997 | Dong et al. | 84/624 |
| 5,677,962 | 10/1997 | Harrison et al. | 381/109 |
| 5,731,534 | 3/1998 | Tamura et al. | 84/622 |
| 5,744,739 | 4/1998 | Jenkins | 84/603 |
| 5,745,583 | 4/1998 | Koizumi et al. | 381/104 |
| 5,808,575 | 9/1998 | Himeno et al. | 341/139 |
| 5,812,677 | 9/1998 | Tamaru | 381/61 |
| 5,883,963 | 3/1999 | Tonella | 381/104 |
| 5,907,622 | 5/1999 | Dougherty | 381/108 |

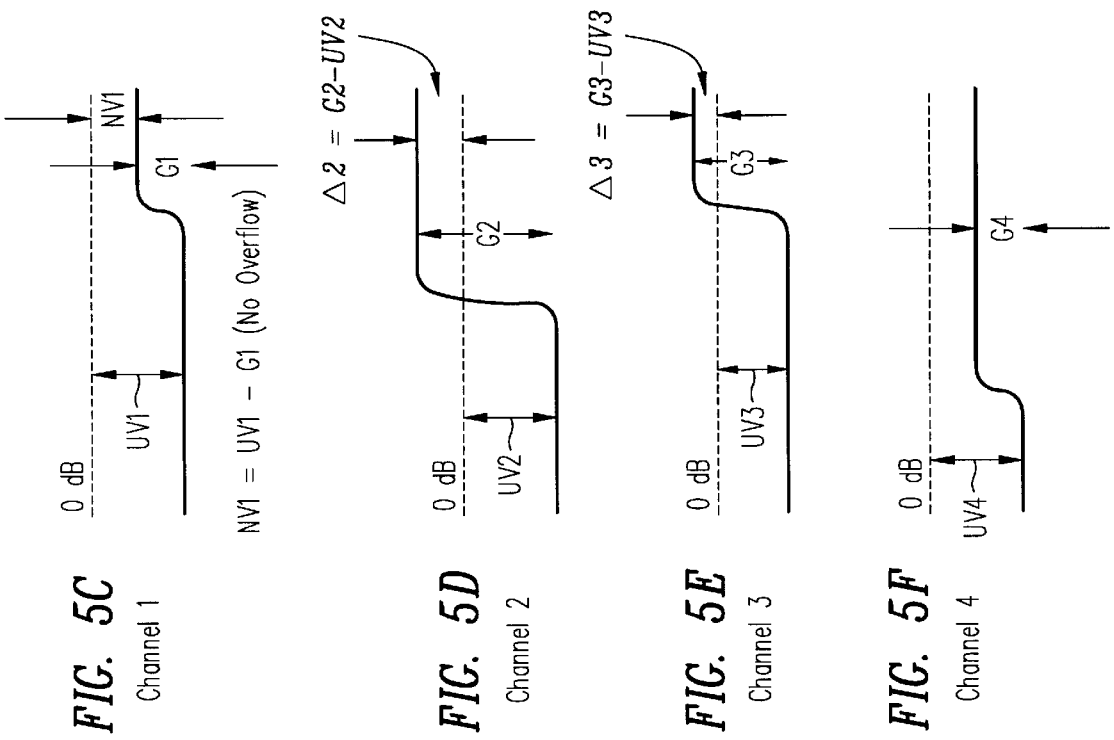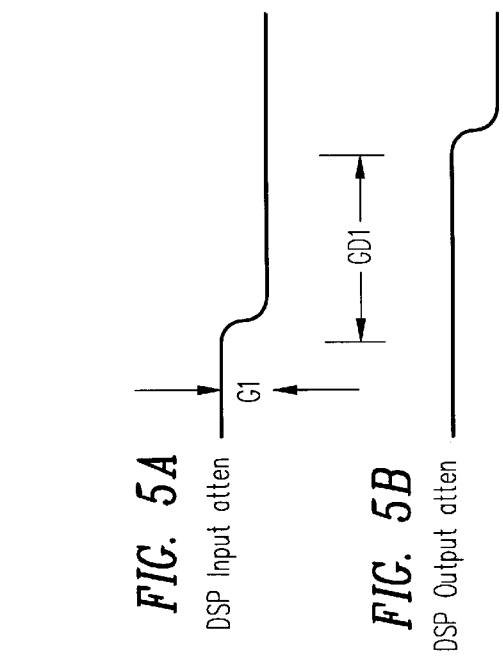
FIG. 5A DSP Input atten
FIG. 5B DSP Output atten
FIG. 5C Channel 1
FIG. 5D Channel 2
FIG. 5E Channel 3
FIG. 5F Channel 4
$\Delta i = Gi - UVi$
$\Delta = max(0, \Delta 1, \Delta 2, \Delta 3, \Delta 4)$
$NVi = UVi - Gi + \Delta$

| User Volume (Attenuation) UV | DSP Compensating Gain G | Δ | New Volume NV | Comment |
|---|---|---|---|---|
| 8 | 12 | 4 | 8−12+4 = 0 | Δ = 4 |
| 10 | 12 | 2 | 10−12+4 = 2 | |
| 12 | 12 | 0 | 12−12+4 = 4 | |
| 14 | 12 | −2 | 14−12+4 = 6 | |

DYNAMIC VOLUME CONTROL SYSTEM

BACKGROUND OF THE INVENTION

1. Field of the Invention

The present invention relates to an audio signal processor and generator. More specifically, the present invention relates to an audio signal processor and generator including a dynamic volume control system.

2. Description of the Related Art

Signal processors typically operate by changing various characteristics of a signal. For example, an audio signal processor may include a graphic equalizer or a parametric equalizer to improve the quality of a sound signal. The graphic equalizer and parametric equalizer control the gain of audio signals in selected frequency bands to subjectively improve the generated sound. Often the graphic equalizer and parametric equalizer boost the gain.

One problem that occurs in signal processors in an audio processing system is the possibility of overflow of the signal. If a full-scale input signal is applied to an audio processor and a system user requests a boost in gain of the signal, then the output signal generated by the audio processor exceeds full scale. Typically, the audio signal processor does not have a sufficient digital (bit) capacity to handle the boosted signal, resulting in signal errors such as overflow including clipping or wrapping of a signed signal to the opposite sign. Signal clipping and overflow are highly disadvantageous in processing of audio signals.

For example, clipping of a signal in the form of a sine wave creates multiple harmonic signals, distorting the frequency information of the signal, canceling the amplitude information in the signal, and creating distortion in the resulting sound signal.

What is needed is an audio processor that avoids signal distortion, clipping, overflow and wrapping.

SUMMARY OF THE INVENTION

A dynamic volume control system in an audio processor uses gain and delay signals from a digital signal processor to dynamically control the user-selected volume of the audio processor. The digital signal processor executes audio signal processing operations that affect the gain applied to the audio signal so that the signal gain inherent in the signal processing path is known. The digital signal processor transfers the known gain and a predicted group delay signal to the dynamic volume control system to dynamically adjust the user-selected volume of the system. The digital signal processor is integrated with a digital-to-analog converter (DAC) in a dynamic volume control system that exploits the known gain and group delay to perform DAC volume control.

In accordance with an embodiment of the present invention, a volume control system includes a digital signal processor connected to a signal pathway and including special-purpose functional processing logic operational upon a signal transmitted on the signal pathway. The special-purpose functional processing logic applies a gain to the signal. The volume control system further includes an attenuator circuit connected in the signal pathway and having a control terminal. The attenuator circuit controls attenuation of the signal transmitted in the signal pathway according to a control signal at the control terminal. The volume control system also includes a volume control circuit connected to the digital signal processor and connected to the attenuator circuit. The volume control circuit includes a difference circuit for determining a difference between the gain and a volume control signal. The difference is connected to the control terminal of the attenuator circuit and supplying the control signal.

BRIEF DESCRIPTION OF DRAWINGS

The features of the described embodiments believed to be novel are specifically set forth in the appended claims. However, embodiments of the invention relating to both structure and method of operation, may best be understood by referring to the following description and accompanying drawings. The use of the same reference symbols in different drawings indicates similar or identical items.

FIGS. 5A through 5F are a sequence of time waveforms which illustrate the operation of the dynamic volume control system shown in FIG. 4.

DESCRIPTION OF THE PREFERRED EMBODIMENTS

Figure 1:
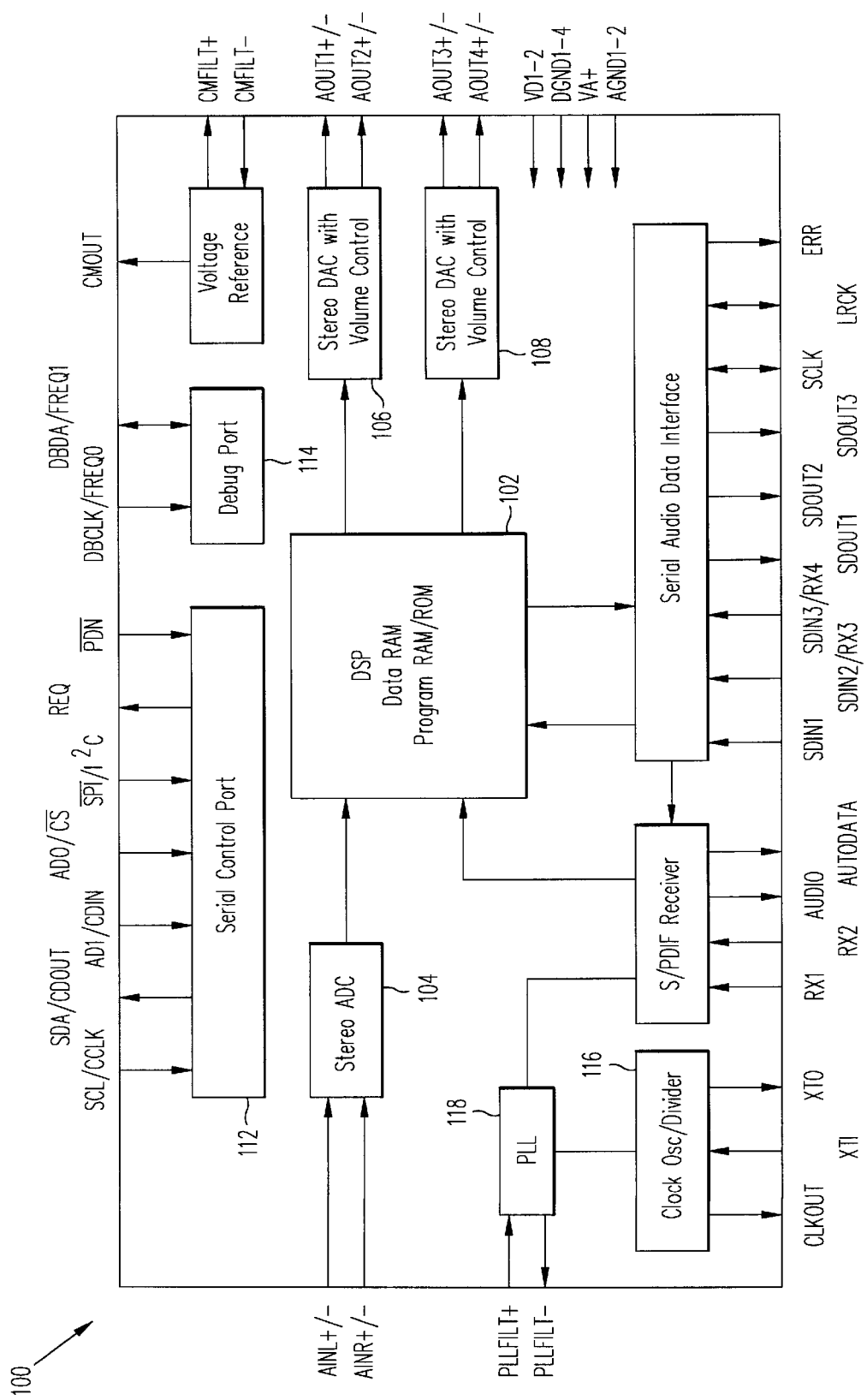
FIG. 1 is a schematic block diagram illustrating an integrated audio processor circuit for implementing an embodiment of a volume control system.

Referring to FIG. 1, a schematic block diagram illustrates an integrated audio processor circuit 100 that is suitable for implementing a dynamic volume control system which dynamically adjusts volume based on data processed by a digital signal processor 102. The audio processor circuit 100 includes the core digital signal processor 102 which receives digital audio signals from a stereo analog-to-digital converter (ADC) 104 and a S/PDIF receiver 120 that is known in the art. The core digital signal processor 102 supplies processed digital audio signals to a first stereo digital-to-analog converter (DAC) with volume control 106, and a second stereo DAC with volume control 108. The stereo ADC 104 accepts audio signals from input lines AINL and AINR. The core digital signal processor 102 receives control signals from an external source via a serial control port 112. The core digital signal processor 102 receives test control signals from a debug port 114. Timing signals are generated by an oscillator/divider circuit 116 and controlled by a phase-locked loop 118. The core digital signal processor 102 includes 6 Kbytes of dynamic random access memory (DRAM) for data storage including temporary storage of sound signal data. The core digital signal processor 102 also includes 2 Kbytes of program memory for implementing processes and methods including programs implementing the functions of the dynamic volume control system. In the illustrative embodiment, the stereo ADC 104 has 24-bit resolution, 100 dB dynamic range, 90 dB interchannel isolation, 0.01 dB ripple, and 80 dB stopband attenuation. The first stereo DAC with volume control 106 and the second stereo DAC with volume control 108 are 24-bit resolution digital-to-analog converters having 108 dB signal-to-noise ratio, 100 dB dynamic range, 90 dB interchannel isolation, 0.01 dB ripple, 70 dB stopband attenuation, and 238 step attenuation at 0.5 dB per step.

In the illustrative embodiment, the dynamic volume control system is employed in the audio processor circuit 100 for usage in an audio system. The audio processor circuit 100 has four channels corresponding to a left front speaker, a right front speaker, a left rear speaker, and a right rear speaker. The dynamic volume control system is highly advantageous in an audio system for avoiding signal clipping that often creates unpleasant sounds.

The audio processor circuit 100 receives audio signals via the stereo ADC 104 and processes the signals in the core digital signal processor 102. The core digital signal processor 102 includes computational code for executing audio signal processing operations and storing audio signal data in the 6 Kbyte memory within the core digital signal processor 102.

Figure 2:
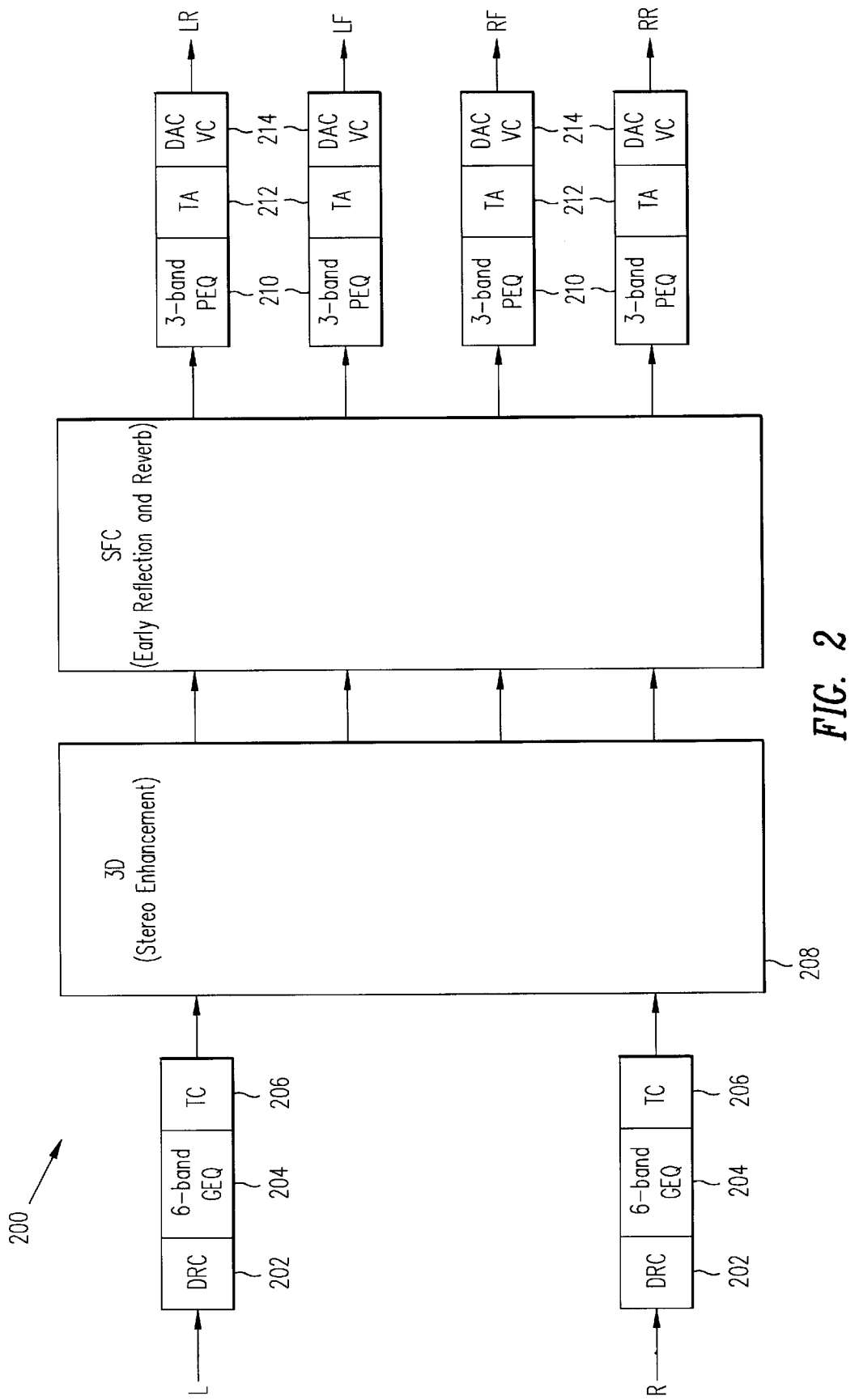
FIG. 2 is a schematic functional block diagram illustrating operations performed by a digital signal processor of an audio digital signal processing method including operations of the volume control system.

Referring to FIG. 2, a high-level schematic functional block diagram illustrates operations of an audio digital signal processing method 200, the operations including a dynamic volume control system operation. The audio digital signal processing method 200 includes processing of a left channel and a right channel. Dynamic range compression (DRC) 202 is performed independently in the left and right channels to dynamically enhance the low level sound signals in the presence of noise. The compressed signals in the left channel and the right channel are respectively equalized using left and right channel 6-band graphic equalizers (GEQ) 204. Tone control 206 is used in the left and right channels to dynamically boost or reduce the treble and base signals. A three-dimensional stereo enhancement process 208 improves sound quality. The four output channels are individually processed using a 3-band parametric equalizer (PEQ) process 210, a time alignment process 212, and a volume control (VC) process 214. The time alignment process 212 adjusts delay intervals for the four output channels to achieve in-phase sound signals throughout a three-dimensional space. Signals from the time alignment process 212 are applied to the dynamic volume control system to improve the generated sound by preventing clipping of audio signals and balancing the volume among multiple audio channels. Signals from the dynamic volume control system are divided into four output channels including right front, left front, right rear, and left rear channels.

The graphic equalizers (GEQ) 204 perform a tone control operation in which the frequency range is divided into bands. The signal in each band is adjusted according to position in the frequency range to modify the relative frequency response of an audio frequency amplifier used in the reception or production of sound to produce a subjectively more pleasing sound.

Figure 3:
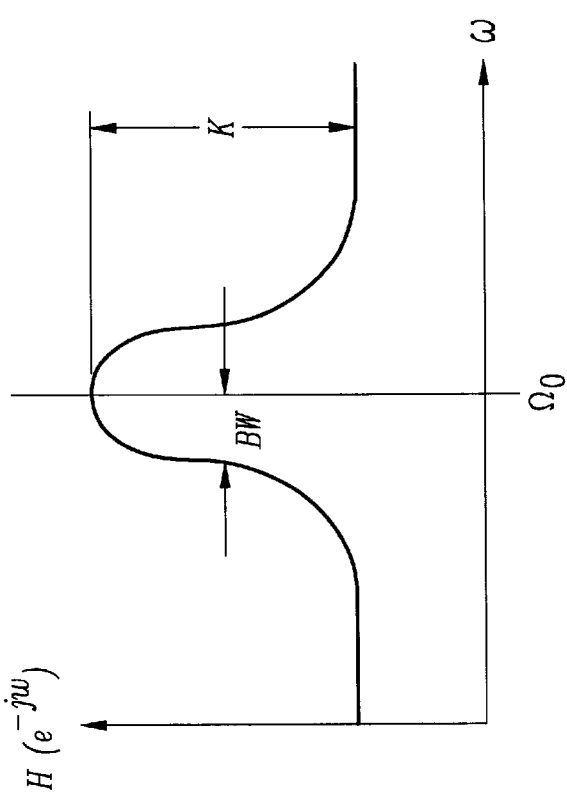
FIG. 3 is a frequency response graph illustrating an operation of equalization, such as parametric equalization or graphic equalization, that is performed by a digital signal processor.

Referring to FIG. 3, a frequency response graph illustrates the operation of equalization, such as parametric equalization or graphic equalization. Specifically, FIG. 3 shows an example of the frequency response of one stage of the parametric equalizer (PEQ) process 210. The graphic equalizers (GEQ) 204 operate according to similar principles. The graphic equalizer and parametric equalizer control the gain of audio signals in selected frequency bands to subjectively improve the generated sound. Often the graphic equalizer and parametric equalizer manipulate the audio signal by boosting the gain. The graphic equalizer (GEQ) 204 is fundamentally a signal booster that boosts the audio signal in selected frequency bands.

A full-scale signal, which is usually equal to 1, is shown as the base signal level in FIG. 3. An audio system user generates one or more input signals generally by manipulating control dials, switches, potentiometers, and the like. The input signals specify various parameters for executing operations. For the operation of parametric equalization (PEQ) 210, the user defines a center frequency $\Omega_0$, a gain amount the signal is boosted at or around the center frequency $\Omega_0$, and a signal bandwidth $\rho$. In one embodiment, the gain is specified as the amount of gain per step, up to a maximum gain level of 12 dB.

One problem to be addressed in an audio processor system is the possibility of overflow of the signal. If a full-scale input signal is applied to the core digital signal processor 102, the user requests a gain of 12 dB, and the core digital signal processor 102 has capacity to handle only the full-scale signal, then the output signal of the core digital signal processor 102 is 12 dB above full-scale. The core digital signal processor 102 does not have a sufficient bit capacity to express the generated signal, resulting in signal errors such as overflow including clipping or wrapping of a signed signal to the opposite sign. Signal clipping and overflow are highly disadvantageous in processing of audio signals.

For example, clipping of a signal in the form of a sine wave creates multiple harmonic signals, distorting the frequency information of the signal, canceling the amplitude information in the signal, and creating distortion in the resulting sound signal.

The problem of clipping, overflow, and wrapping of audio signals is addressed using a volume control system including a digital signal processor in combination with a digital-to-analog converter (DAC) volume controller.

Figure 4:
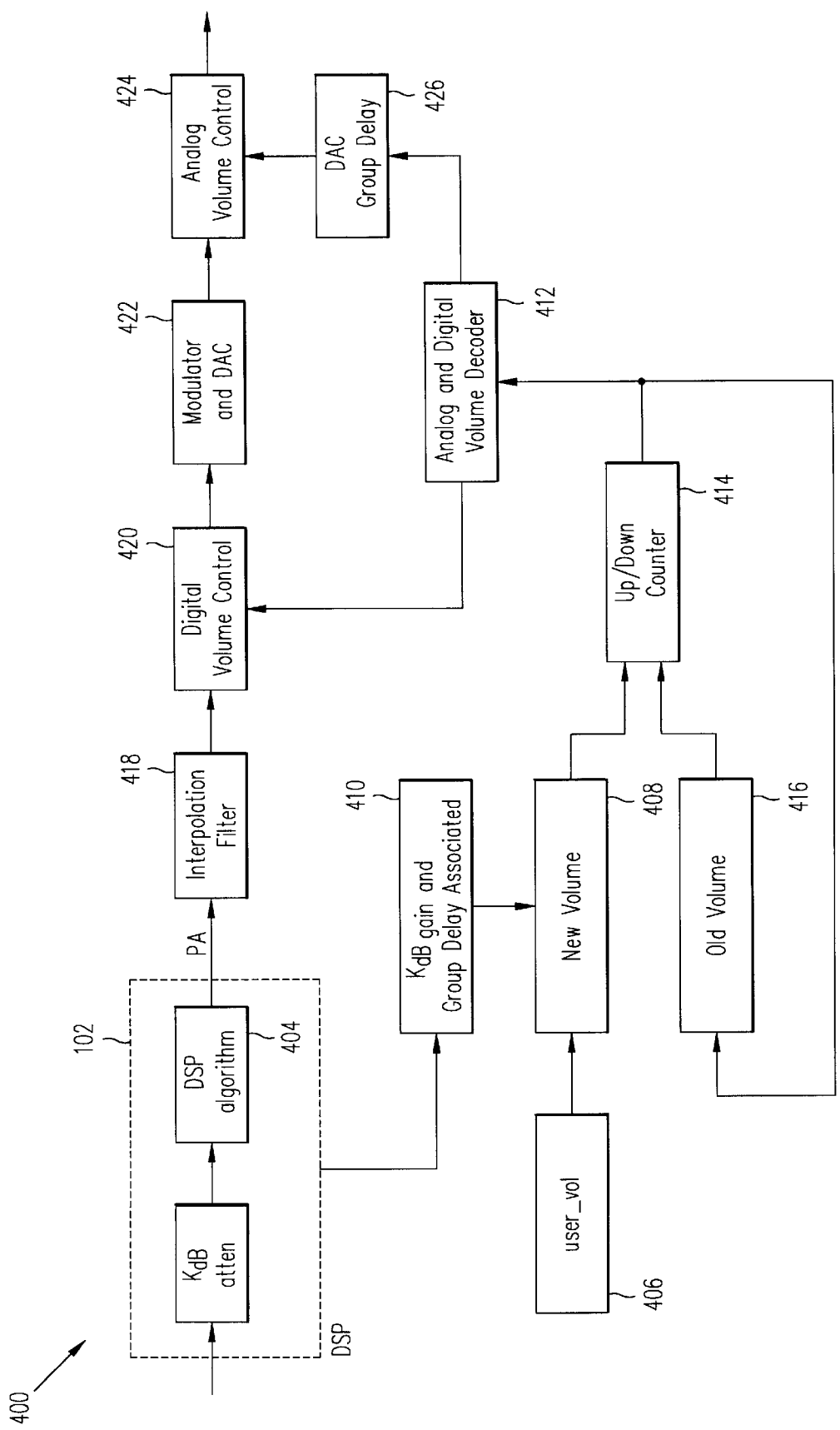
FIG. 4 is a schematic functional block diagram showing an embodiment of a dynamic volume control system in accordance with an embodiment of the present invention.

Referring to FIG. 4, a schematic functional block diagram illustrates a dynamic volume control system 400 for one channel of the audio processor circuit 100. The dynamic volume control system 400 includes an interface of the core digital signal processor 102 and a digital-to-analog converter (DAC) volume controller 422 which attenuates a signal by $K_{dB}$ to avoid overflow in the digital signal processor 102. An input audio signal is applied to the core digital signal processor 102, attenuated by a $K_{dB}$ attenuator and a DSP algorithm or operation 404 implemented within the core digital signal processor 102. The core digital signal processor 102 generates signals including a processed audio (PA) signal, an attenuated audio (AA) signal, and a group delay (GD) signal. A new volume register 408 receives a user control signal from a control port 406 at a first input terminal and receives a DSP gain signal from the core digital signal processor 102 via a gain element $K_{dB}$ 410 at a second input terminal. The new volume register 408 is controlled by a programmable group delay signal GD1 which is passed as the group delay signal from the core digital signal processor 102 via a group delay counter $K_{dB}$ 412. The group delay (GD) reflects the time delay incurred during processing of the audio signal flow in various components of the dynamic volume control system 400 such as the core digital signal processor 102, the interpolation filter 418, the digital volume attenuator 420, the DAC volume controller 422, and the analog volume attenuator 424. The group delay serves to maintain time alignment in the signal processing path.

An output signal from the new volume register 408 is applied to a first input terminal of an up-and-down counter 414. An old volume register 416 temporarily stores a volume signal which is received from the output terminal of the up-and-down counter 414. The old volume register 416 applies the old volume signal to a second input terminal of the up-and-down counter 414. The up-and-down counter 414 compares the new volume in the new volume register 408 to the old volume in the old volume register 416. If the new volume is greater then the up-and-down counter 414 increments the value of the old volume and writes the incremented value to the old volume register 416. Otherwise, the up-and-down counter 414 decrements the old volume and writes the decremented value to the old volume register 416. Once a selected volume is generated by the up-and-down counter 414, the volume control is separated into digital volume control and analog volume control.

The processed audio signal from the core digital signal processor 102 is interpolated by an interpolation filter 418 then attenuated a controlled amount by a digital volume attenuator 420. The digital volume attenuator 420 attenuates the processed audio signal by an amount that is determined by an output control signal from the up-and-down counter 414. The processed audio signal following attenuation by the digital volume attenuator 420 is processed and converted to an analog audio signal by a modulator and DAC 422 then further attenuated using an analog volume attenuator 424. In the illustrative embodiment, the modulator and DAC 422 is a delta-sigma modulator DAC that interpolates a signal into high rate then converts the data to a single bit. The single-bit data is then converted to an analog signal. The analog volume attenuator 424 attenuates the analog audio signal by an amount that is determined by the output control signal from the up-and-down counter 414 but passed through a DAC group delay counter 426. A small amount of delay is inserted between the digital volume control and the analog volume control because some group delay is associated with engaging the modulator and DAC 422.

In the illustrative embodiment, the core digital signal processor 102 forms a 24-bit data path for the audio signal. The 24-bit data path passes through the core digital signal processor 102, the modulator and DAC 422, and the volume control elements including the digital volume attenuator 420 and analog volume attenuator 424.

The digital volume attenuator 420 and the analog volume attenuator 424, in combination, form a volume control circuit that attenuates the audio signal by a suitable amount. The dynamic volume control system 400 advantageously is controlled by a single user-directed volume signal to simplify operations. The dynamic volume control system 400 advantageously imposes only a limited computational burden on the core digital signal processor 102. The dynamic volume control system 400 advantageously controls the volume dynamically to avoid clipping of the audio signal.

The dynamic volume control operation supports fine control of volume, allowing attenuation of the signal by amounts as small as 0.5 dB. The dynamic volume control operation is closely combined with the conversion process of the modulator and DAC 422 with the digital volume attenuator 420 preceding the modulator and DAC 422 and the analog volume attenuator 424 applied following the conversion of the audio signal from digital form to analog form by the modulator and DAC 422. The analog volume attenuator 424 is applied for the first 23 dB of attenuation of the audio signal and attenuates both the audio signal and noise, including signal noise and quantization noise. In contrast, the digital volume attenuator 420 only attenuates the audio signal and does not attenuate quantization or signal noise. Digital volume control supplies attenuation in excess of the first 23 dB, for example to a total attenuation of 119 dB. The total volume control is the sum of the analog volume control and the digital volume control.

Figures 6, 9:
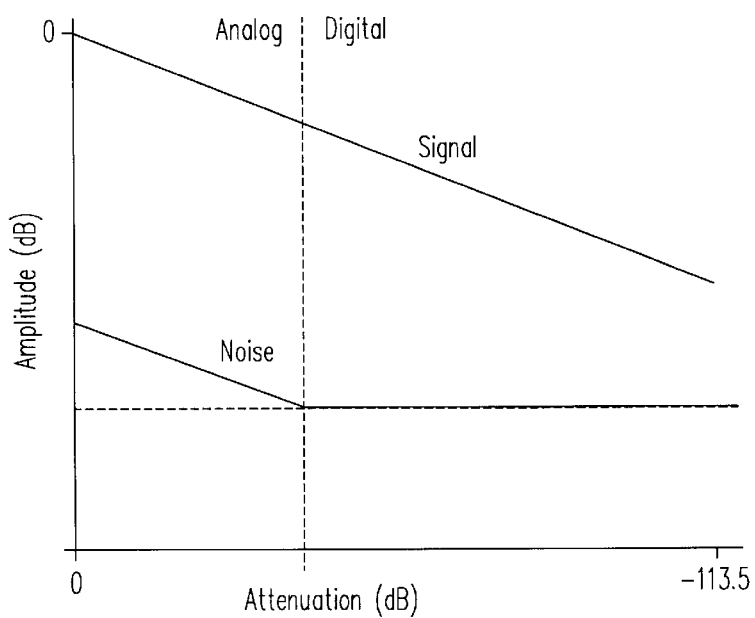
FIG. 6 is a table which illustrates the setting of the new volume (NV) through the operation of the dynamic volume control system.
FIG. 9 is a graph illustrating the amplitude/attenuation relationship of the signal in comparison to the noise using a hybrid analog/digital volume control scheme.

In the illustrative embodiment, both analog attenuation and digital attenuation are used because analog volume control is relatively expensive in comparison to digital volume control. Level changes are implemented with an analog volume control until the residual output noise is equal to the noise floor in the mute state at which point volume changes are performed digitally. A hybrid analog/digital volume control scheme is superior to purely digital volume control techniques since noise is attenuated by the same amount as the signal, preserving dynamic range. The superiority of the hybrid technique is shown in FIG. 9, a graph illustrating the amplitude/attenuation relationship of the signal in comparison to the noise.

The core digital signal processor 102 is a processor that includes a data memory and a program memory. The program memory is programmed with executing program code implementing the graphic equalizers (GEQ) 204 and the parametric equalizer (PEQ) processes 210. A user specifies the operations to be performed by the core digital signal processor 102 through actuation of a control button or a control switch. Once the user specifies an operation, such as commencement of operations in a graphic EQ mode or a parametric EQ mode, the core digital signal processor 102 anticipates the possibility of overflow by reducing the input gain. The operations performed by the core digital signal processor 102 impose known characteristics, such as a known gain, on the audio signal. The dynamic volume control system 400 compensates for the modification of the signal.

For example, if a user requests graphic EQ mode operation, the operation of the core digital signal processor 102 causes imposition of a known gain, such as 12 dB, on the audio signal. To avoid clipping, the core digital signal processor 102 attenuates the input signal by 12 dB, maintaining a full-scale signal (0 dB attenuation).

The audio signal is attenuated by the core digital signal processor 102 by a controlled amount to avoid overflow in operation executed by the core digital signal processor 102. The attenuation by the core digital signal processor 102 is compensated by the volume control system including the digital volume attenuator 420 and the analog volume attenuator 424 to maintain an audio signal at an essentially unchanged level. The interface between the core digital signal processor 102 and the volume control system is highly advantageous for maintaining a signal without distortion, clipping, or overflow while sustaining a suitable signal level at or near full-scale.

The interface between the core digital signal processor 102 and the volume control elements including the digital volume attenuator 420 and the analog volume attenuator 424 functions on the basis of information sharing with the core digital signal processor 102 supplying information including a $K_{dB}$ attenuation and group delay.

The volume controller coordinates the gain information, attenuation information and group delay information that is applied to govern the dynamic volume control system 400. The core digital signal processor 102 attenuates the audio signal, then supplies compensating gain control signals to the dynamic volume control system 400 to restore the gain of the audio signal. The core digital signal processor 102 supplies group delay signals to control when the modification of gain in the volume control elements takes place according to the operation performed by the core digital signal processor 102.

The volume control operation is further complicated due to the multiple-channels of the audio processor circuit 100 in which the first and second stereo DACs with volume control 106 and 108 include four audio channels. The core digital signal processor 102 supplies a group delay value and an attenuation value to each of the channels. The time alignment for each channel may be different to accommodate variability in speaker position of the channels.

Referring to FIGS. 5A through 5F, a sequence of time waveforms illustrates the operation of the dynamic volume control system 400. FIG. 5A illustrates the application of the DSP input attenuation of G1=$K_{dB}$ by the core digital signal processor 102. In one example, the DSP input attenuation G1 has a value of 12 dB. Note that the DSP input attenuation GI changes gradually to eliminate instability that results in pops and clicks in an audio output signal. FIG. 5B shows the DSP output gain from the core digital signal processor 102 which is delayed by a group delay 1 (GD1) interval. The core digital signal processor 102 sets a group delay interval for each channel output gain G. The dynamic volume control system 400 responds to the setting of the DSP compensating gain G1 and the group delay GD by the core digital signal processor 102, and the setting of a user volume UV by a user control signal to determine a new volume control parameter.

The user volume UV is determined by adjustment of a user volume control switch, dial, knob, or the like, generating a user volume UV value that is typically entered in a microcontroller (not shown) and stored in a storage such as a memory or register. The user volume UV control parameter serves as a serial control point for adjusting an effective new volume control (NV) through the operation of the stereo DAC volume control. The new volume is determined as a combination of the selected user volume and the gain G from the core digital signal processor 102. FIG. 6 is a table which illustrates the setting of the new volume (NV) through the operation of the dynamic volume control system 400.

Referring to FIG. 5C, if the compensating gain G1 of the core digital signal processor 102 is equal to 0 dB, then the new volume is the same as the user volume.

However if, as shown in FIG. 5A, the core digital signal processor 102 attenuates the audio input signal by G1=$K_{dB}$=12 dB, for example, then the new volume tends to be 12 dB higher than the user volume (UV1). Following the group delay (GD1), the core digital signal processor 102 attempts to attenuate the audio signal by G1 (12 dB) so that the new volume (NV1) is equal to the user volume (UV1) minus the DSP gain (G1). For example, if the user volume (UV1) is equal to 23 dB and the DSP attenuation (G1) is 12 dB, then the effective new volume (NV1) is equal to 11 dB.

The effective new volume (NV1) does not exceed zero dB so that no overflow occurs. However if the DSP compensating gain G1 is greater than the user volume for channel 1 (UV1), the new volume in channel 1 (NV1) exceeds zero dB and overflows. Zero dB is the maximum allowed volume control to prevent overflow and signal clipping. Therefore the dynamic volume control system 400 operates by determining the difference between the user-selected user volume UV and the DSP gain G. In channel 1, the dynamic volume control system 400 calculates the difference UV1−G1. If the difference exceeds 0 dB, then the dynamic volume control system 400 does not allow the new volume (NV1) to exceed 0 dB.

The operation of the dynamic volume control system 400 is further complicated by the existence of a plurality of channels. When the DSP gain G is added back to one channel to determine a new volume for the channel, the DSP gain is also added back into the other channels. The new volume is determined as a function of user volume, and DSP gain using an equation as follows:

$$Nvi=Uvi-Gi+\Delta.$$

A maximum delta A is set for all channels according to the following equation:

$$\Delta=\max(0, \Delta 1, \Delta 2, \Delta 3, \Delta 4).$$

Referring to FIG. 5D, for channel 2 the new volume (NV2) is equal to zero so that a delta Δ2 is equal to DSP gain G2 minus user volume UV2. The illustrative delta Δ2 is a relatively large positive number. In FIG. 5E, for channel 3 the new volume (NV3) is equal to zero so that a delta Δ3 is equal to DSP gain G3 minus user volume UV3. The illustrative delta Δ3 is a positive number that is smaller than delta Δ2. In FIG. 5F, for channel 4 the new volume (NV4) is equal to zero so that a delta Δ4 is equal to DSP gain G4 minus user volume UV4. The illustrative delta Δ4 is a negative number so that the delta Δ is set to zero.

The dynamic volume control system 400 determines and compares the delta values for the plurality of channels to determine a maximum delta value that equalizes the volume in all channels, for example including left, right and rear channels in an automobile audio system. By determining and applying the maximum delta value, subtracting the maximum delta value from all channels, the volume is equalized in all channels while overflow, clipping and distortion are avoided.

Figure 7:
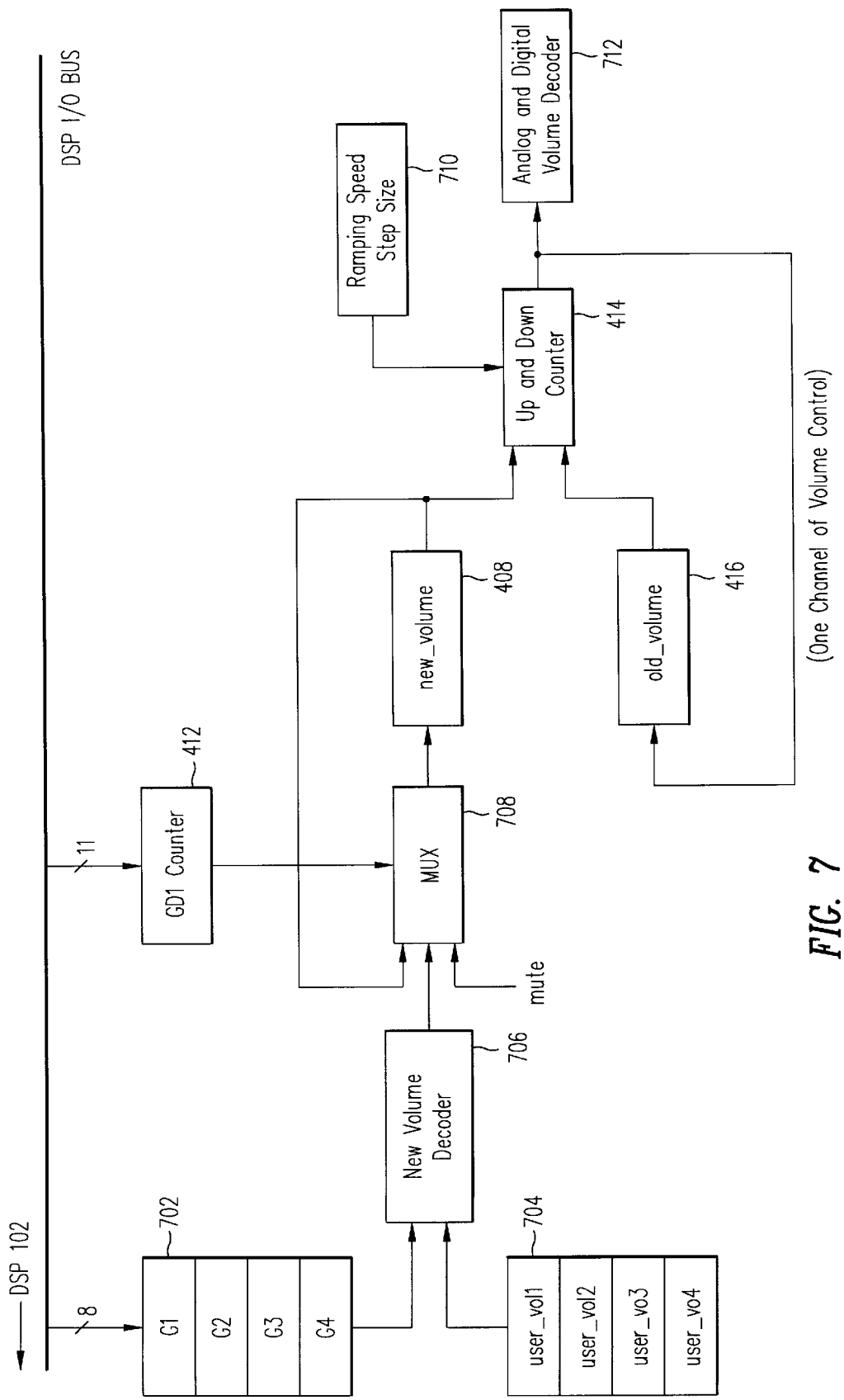
FIG. 7 is a schematic block diagram illustrating an alternative structure of the dynamic volume control system that more clearly illustrates the multiple-channel aspects of the volume control operation.

Referring to FIG. 7, a schematic block diagram illustrates an alternative structure of the dynamic volume control system 400 that more clearly illustrates the multiple-channel aspects of the volume control operation. The dynamic volume control system 400 interfaces to the core digital signal processor 102 via a DSP I/O bus 700 that supplies DSP gain and group delay count signals for volume control. The dynamic volume control system 400 includes a gain buffer 702 that receives and stores DSP gain signals Gi from the core digital signal processor 102. The gain buffer 702 includes a storage element for each channel in the dynamic volume control system 400. The dynamic volume control system 400 also includes a user volume buffer 704 that receives user volume signals from a control port which is set by a user. The user volume buffer 704 includes a storage element for storing a user volume UVi for each channel in the dynamic volume control system 400. The gain buffer 702 and the user volume buffer 704 each supply a respective gain and user volume signal to a new volume decoder 706 that determines a new volume signal for controlling the volume of the audio system. The new volume decoder 706 is shared among all channels since the new volume does not depend on information in a single channel but rather is determined as a function of the user volume signals in all channels.

The new volume decoder 706 supplies a new volume to a multiplexer 708 that selects from among a mute signal, the current signal from the new volume decoder 706 and a previous new volume from the new volume register 408. The multiplexer 708 performs this selection operation based on a control signal from the group delay counter $K_{dB}$ 412. The multiplexer 708 operates to hold the existing volume control signals at a fixed level if volume and gain signals are not changing. Volume control is changed only when the group delay counter $K_{dB}$ 412 is activated to change the volume control. The core digital signal processor 102 begins a volume control operation by transferring DSP gain values for the multiple channels to the gain buffer 702 and transferring group delay counts to the group delay counter $K_{dB}$ 412. The group delay counter $K_{dB}$ 412 begins down-counting. For example, the core digital signal processor 102 may load a value of 1000 into the group delay counter $K_{dB}$ 412 and down-count to 0 to achieve the selected delay, actuating the multiplexer 708 to receive a new volume from the new volume decoder 706. The new volume is applied to the up-and-down counter 414 and the ramping speed step size controller 710 begins ramping the volume.

The selected signal from the multiplexer 708 is passed to the new volume register 408. The new volume from the new volume register 408 is applied to the first input terminal of the up-and-down counter 414 while the second input terminal is connected to the old volume register 416. The up-and-down counter 414 is controlled by a ramping speed step size controller 710. The count from the up-and-down counter 414 is written to the old volume register 416 and to an analog and digital volume decoder 712 that controls the digital volume attenuator 420 and analog volume attenuator 424 shown in FIG. 4.

Figure 8:
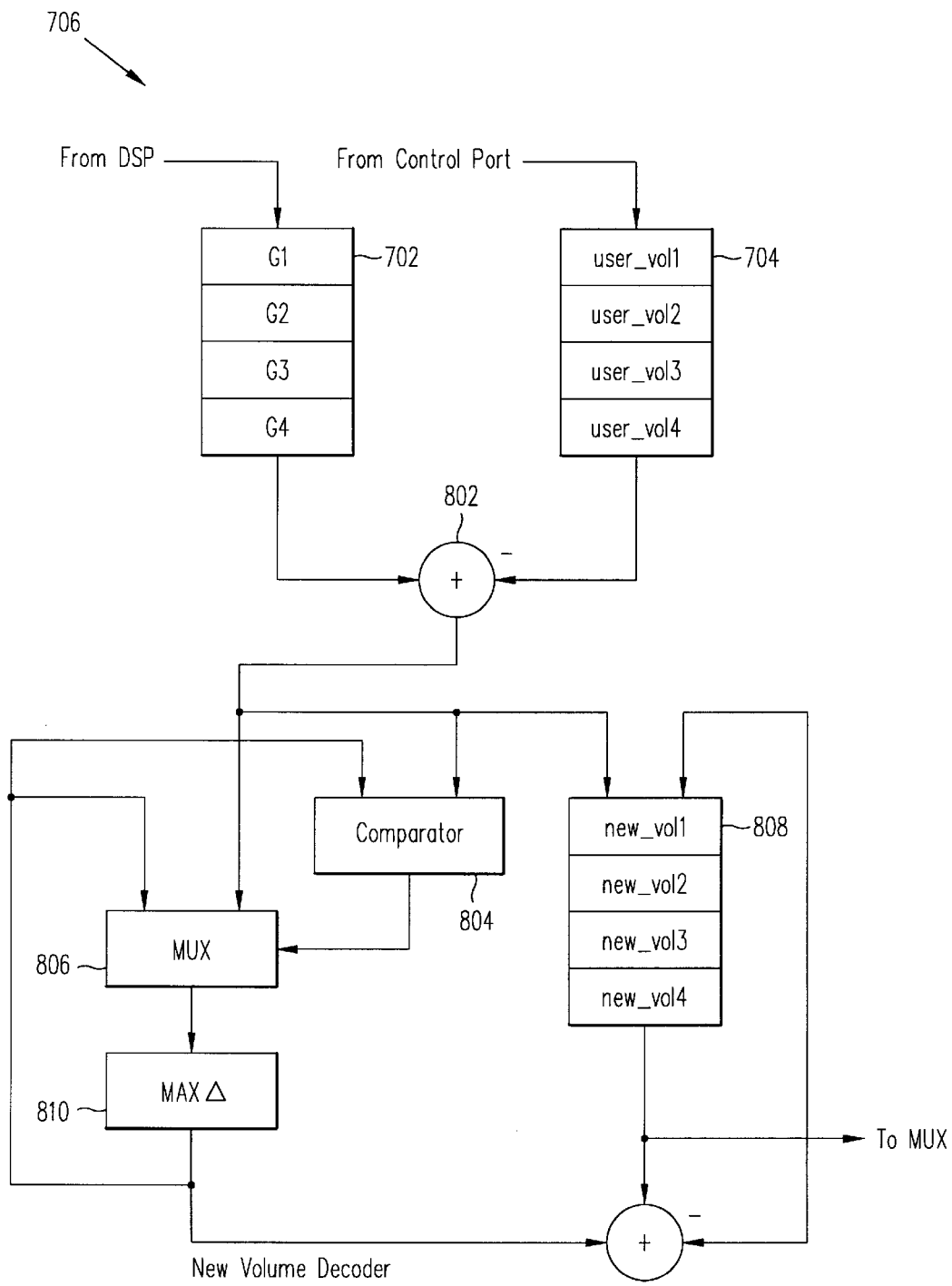
FIG. 8 is a schematic block diagram illustrating an embodiment of a volume decoder for usage in the dynamic volume control system shown in FIG. 7.

Referring to FIG. 8, a schematic block diagram illustrates a suitable embodiment of the new volume decoder 706 shown in FIG. 7. The new volume decoder 706 operates to determine a maximum delta Δ for performing the volume control operation. The new volume decoder 706 receives DSP gain signals corresponding to the multiple channels from the gain buffer 702 at a first input terminal and receives user volume signals corresponding to the multiple channels from the user volume buffer 704. The gain buffer 702 and the user volume buffer 704 each include six registers holding the DSP gain and the user volume, respectively, for each of the six channels.

The user volume signals UVi are subtracted from the DSP gain signals Gi by an adder 802 and the difference delta Δ is written to a comparator 804, a multiplexer 806, and to a new volume buffer 808 to determine a maximum delta Δ for all channels. The maximum delta Δ is initially set to zero so that only a positive or zero value of maximum delta Δ is possible. For each channel, the adder 802 determines a difference value and the comparator 804 determines whether the difference is greater than the existing maximum delta and, if so, replacing the maximum delta value with the difference. The multiplexer 806 selects either the difference signal from the adder 802 or a previous maximum signal from a maximum delta Δ register 810 under the control of the comparator 804. The comparator 804 compares the previous maximum signal from the maximum delta Δ register 810 with the difference signal from the adder 802. If the difference signal is larger than the previous maximum delta Δ, then the difference signal is passed by the multiplexer 806 to the maximum delta Δ register 810. The maximum delta from the maximum delta Δ register 810 is added to a new volume from the new volume buffer 808 and written back to the new volume buffer 808. Once the new volume decoder 706 finds the maximum delta Δ, the maximum delta Δ is added back to the new volume values for each of the multiple channels to compute a new volume. Entries from the new volume buffer 808 are applied to the multiplexer 708.

In an example which is illustrative of the operation of the new volume decoder 706, a user sets the user volume for a system including six channels to values of 8 dB, 10 dB, 12 dB, 14 dB, 16 dB, and 18 dB attenuation. For each channel, the core digital signal processor 102 sets the output gain to 12 dB. The new volume decoder 706 processes the DSP gain signals and the user volumes to determine a suitable delta Δ by determining Gi−UVi. The maximum difference is 4 dB (12 dB−8 dB). The channel that generates the most overflow generates an output signal of 12 dB plus delta Δi. To achieve a maximum audio signal output amplitude of 0 dB, a delta value of 4 dB is added back to all channels. The new volume generated for all channels becomes 0 dB, 2 dB, 4 dB, 6 dB, 8 dB, and 10 dB. The volume-controlled volume is that maximum volume that is achieved without any channel overflowing.

Referring again to FIG. 7, the dynamic volume control system 400 avoids sudden changes in volume through the operation of the ramping speed step size controller 710 and the up-and-down counter 414. The ramping speed step size controller 710 and the up-and-down counter 414 determine how fast the volume target is to be ramped, to control the constant speed of the dynamic volume control system 400. The volume is changed smoothly to avoid discontinuity of signals. The dynamic volume control system 400 operates by attenuating an audio signal. The audio signal may be modeled as a plurality of overlapping sine waves. If sudden volume changes are made by the dynamic volume control system 400 causing a sharp discontinuity in the signal, then much smaller signals are generated, creating harmonics that distort the audio signal. The ramping speed step size controller 710 operates to gradually invoke any changes in the volume or DSP gain. The ramping speed step size controller 710 adjusts the slope of changes in the volume control to match the slope of changes in the DSP output gain. The ramping speed step size controller 710 adjusts changes in the signals to attenuate the audio signal gradually and ramp the volume control gradually.

Advantageously, the core digital signal processor 102 is fully programmable so that the starting point, group delay, and the slope of output gain changes are programmable. A user begins a volume control operation by actuating a volume control input signal to the dynamic volume control system 400. The user thereby changes the set-point of the volume control, altering the user volume in comparison to the old volume in the old volume register 416 and the new volume in the new volume register 408. The newly applied user volume is compared to the DSP gain in the multiple channels and the dynamic volume control system 400 determines a new volume.

The up-and-down counter 414 and the ramping speed step size controller 710 operate to ramp the old volume level to the new volume. The up-and-down counter 414 compares the old volume in the old volume register 416 with the new volume in the new volume register 408. If the new volume is greater than the old volume, the volume is to be incremented. The ramping speed step size controller 710 raises the volume by a selected amount in a clock step. If the new volume is less than the old volume, the volume is decremented in a plurality of clock steps.

Figure 10:
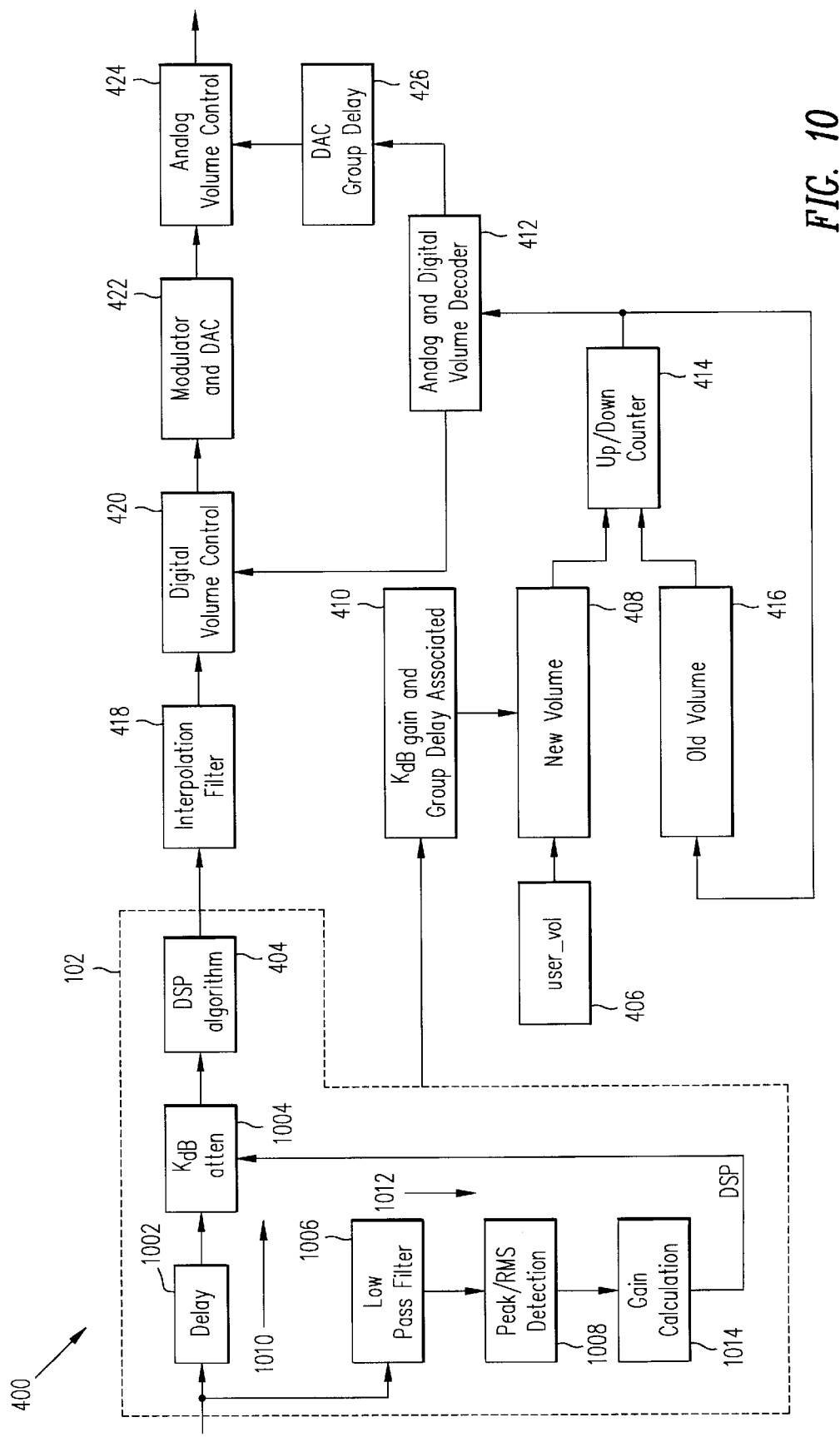
FIG. 10 is a schematic functional block diagram showing an embodiment of a dynamic volume control system with specific elements of dynamic gain adjustment.

Referring to FIG. 10, a schematic functional block diagram shows an embodiment of a dynamic volume control system 400 for one channel of the audio processor circuit 100 designating specific elements of dynamic gain adjustment. The core digital signal processor 102 has a signal path 1010 including a delay block 1002, an attenuation block 1004, and a DSP algorithm block 404. The core digital signal processor 102 also has a control path 1012 for controlling the attenuation block 1004 in the signal path 1010. The control path 1012 includes a low pass filter 1006, a peak/rms detector 1008, and a gain calculation block 1014. The $K_{DB}$ attenuation of the attenuation block 1004 is varied according to the input signal level. The delay block 1002 is inserted previous to the attenuation block 1004 to account for the group delay that occurs during the control path 1012 to perform the gain calculation. A predictable time interval elapses during the low pass filter 1006, peak/rms detector 1008, and gain calculation block 1014 calculations. The predicted time is set as a delay interval in the delay block 1002 so that the operations in the signal path 1010 and the control path 1012 are synchronized.

The low pass filter 1006 removes transient high frequency input signal levels that misinterpret the overall average amplitude of the input signal. The low pass filter 1006 is useful for preventing erroneous and potentially unstable adjustment of the gain.

Figure 11:
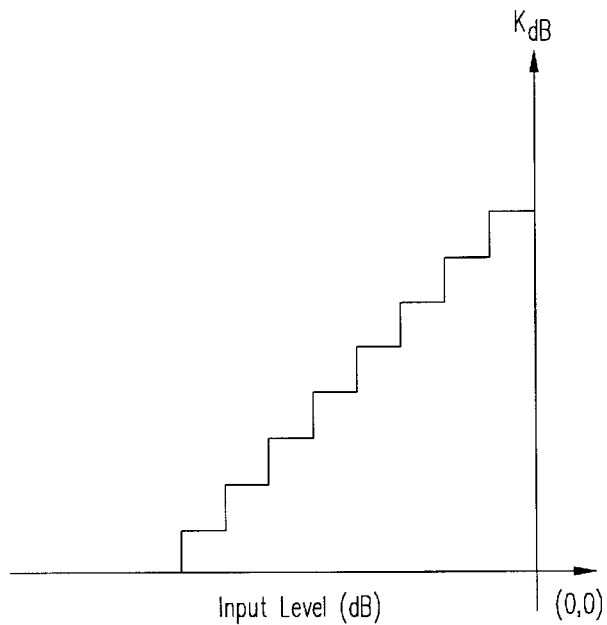
FIG. 11 is a graphical illustration showing an embodiment of a suitable mapping relationship of input level to gain for dynamic gain adjustment.

The peak/rms detector 1008 determines rms peak signal which is used to scale the gain calculation. The gain calculation block 1014 receives the rms peak signal and maps the input signal amplitude into a $K_{DB}$ gain value for application to the attenuation block 1004 in the signal path 1010. In one embodiment of the gain calculation block 1014, a mapping is performed according to a transfer function 1100 shown in FIG. 11, a graphical illustration showing a suitable mapping relationship of input level to gain for dynamic gain adjustment.

Figure 12:
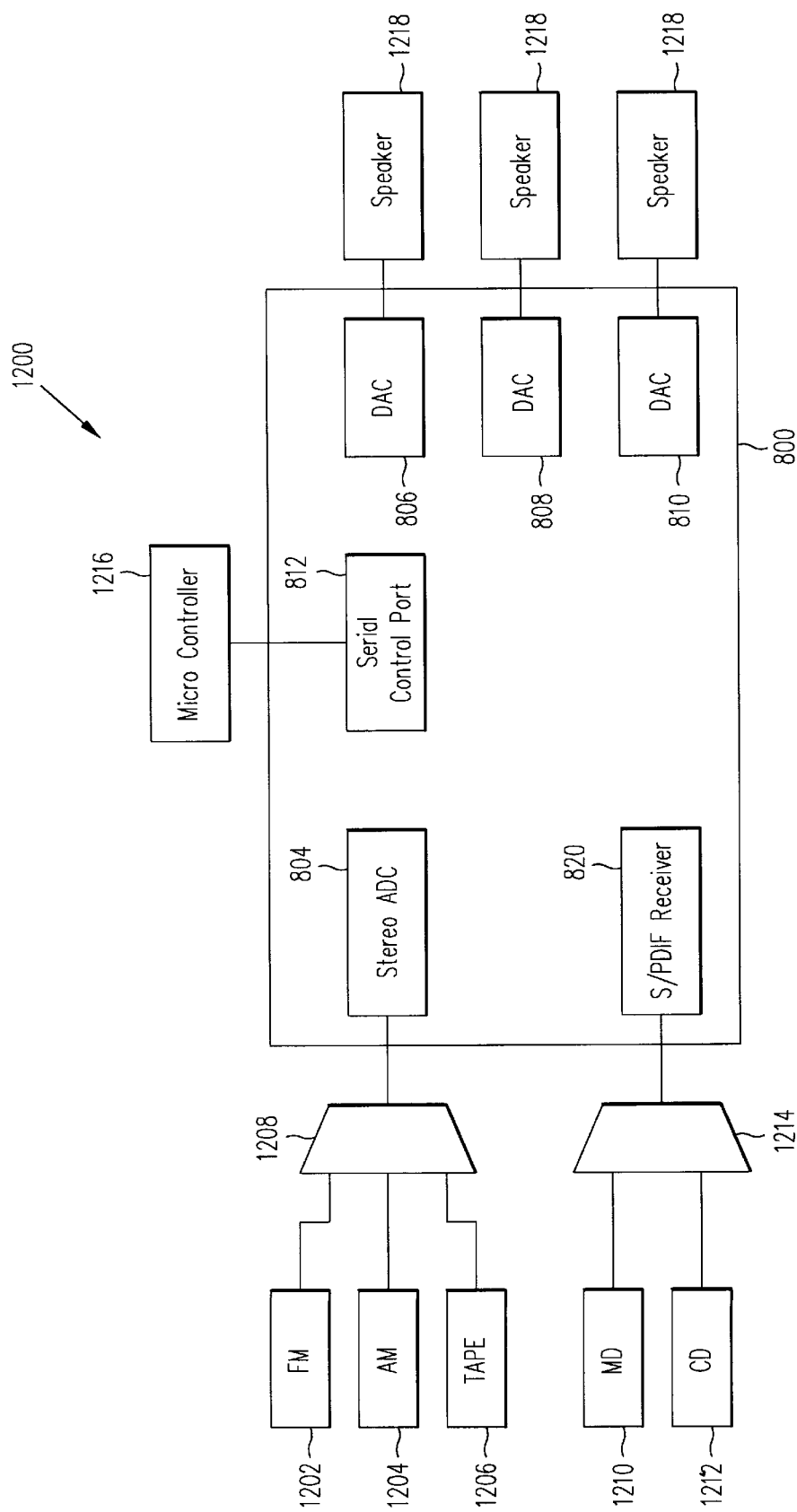
FIG. 12 is a schematic block diagram illustrating an embodiment of an audio/home theatre system utilizing the audio processor circuit.

Referring to FIG. 12 in conjunction with FIG. 10, a schematic block diagram illustrates an embodiment of an audio/home theatre system 1200 utilizing the audio processor circuit 100. The audio processor circuit 100 receives input signals originating from multiple various media types including FM radio 1202, AM radio 1204, cassette tape 1206 via a multiplexer 1208. The multiplexer 1208 is connected to the stereo ADC 104 to supply signals for performance by the audio processor circuit 100. The audio processor circuit 100 also receives input signals originating from further media types such as minidisk 1210 and compact disk 1212 via a multiplexer 1214. The multiplexer 1214 is connected to the S/PDIF receiver 120 to supply signals for performance by the audio processor circuit 100. The audio processor circuit 100 is controlled by signals from a control device such as a microcontroller 1216 that is connected to the audio processor circuit 100 via the serial control port 112. Audio signals generated by the audio processor circuit 100 are transmitted via first stereo DAC 106, second stereo DAC 108, and third stereo DAC 110 to speakers 1218 to produce sound signals.

Figure 13:
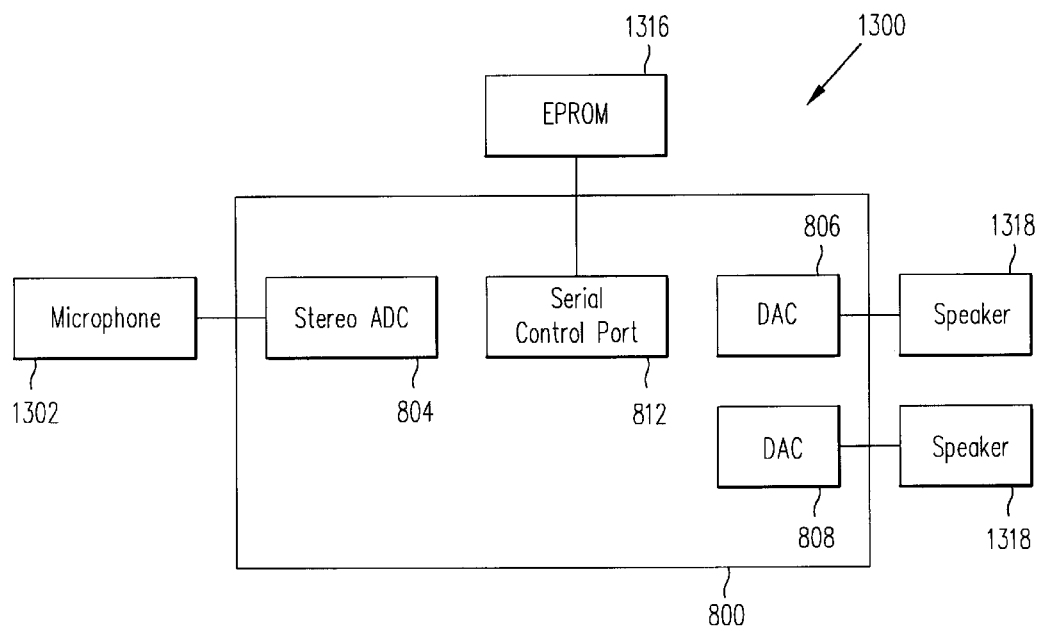
FIG. 13 is a schematic block diagram illustrating an embodiment of an electronic musical instrument system utilizing the audio processor circuit.

Referring to FIG. 13 in conjunction with FIG. 10, a schematic block diagram illustrates an embodiment of an electronic musical instrument system 1300 utilizing the audio processor circuit 100. The audio processor circuit 100 receives input signals originating from multiple a microphone 1302 connected to the stereo ADC 104 to supply signals for performance. The audio processor circuit 100 is controlled by signals, including music generation codes, from a control device such as a nonvolatile memory 1316, for example an E2PROM, that is connected to the audio processor circuit 100 via the serial control port 112. Audio signals generated by the audio processor circuit 100 are transmitted via first stereo DAC 106, and second stereo DAC 108 to speakers 1318 to produce sound signals.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, the illustrative dynamic volume control system is controlled by a process executed on a digital signal processor controlled by software. In other embodiments, the early dynamic volume control system may be implemented as a circuit of logic implementation. In other embodiments, the dynamic volume control system may be implemented using a general-purpose computer, a microprocessor, or other computational device.

What is claimed is:

1. A volume control system comprising:

a digital signal processor coupled to a signal pathway that includes a logic for executing a digital signal processing operation operational upon a signal transmitted on the signal pathway, the the digital signal processing operating imposing a gain on the signal;

an attenuator circuit coupled to the digital signal processor in the signal pathway and having a control terminal, the attenuator circuit controlling attenuation of the signal transmitted in the signal pathway according to a control signal at the control terminal; and a volume control circuit coupled to the digital signal processor and coupled to the attenuator circuit, the volume control circuit being coupled to receive a user volume signal and including a difference circuit for determining a difference between the gain and the user volume signal, a logic for determining an overall gain signal based on a maximum difference signal of the differences between gain and user volume in a plurality of signal channels, and a logic for determining a new volume signal based on the user volume minus the gain plus the overall gain signal, the new volume signal being coupled to the control terminal of the attenuator circuit and controlling the volume as the control signal.

2. A volume control system according to claim 1, further comprising:

a user volume control port coupled and supplying a user volume signal to the volume control circuit, the volume control circuit difference circuit determining a difference between the gain and the user volume signal.

3. A volume control system according to claim 1, further comprising:

a digital-to-analog converter (DAC) coupled between the digital signal processor and the attenuator in the signal pathway, the DAC converting a digital signal from the digital signal processor into an analog signal for attenuation by the attenuation circuit.

4. A volume control system according to claim 1, wherein:
the digital signal processor special-purpose functional processing logic further includes a logic predicting a group delay in the signal pathway; and
the volume control circuit further includes a timing circuit timing the operation of the difference circuit.

5. A volume control system according to claim 1, wherein: the volume control circuit includes:
a difference circuit coupled to the digital signal processor to receive the gain and coupled to a user volume control port, the difference circuit determining the difference between the gain and the user volume signal;
a new volume register coupled to the difference circuit and holding the difference as a new volume;
an old volume register;
a counter having a first input terminal coupled to the new volume register and having a second input terminal coupled to the old volume register, the counter decrementing or incrementing a volume depending on the relative amplitude of data in the new volume register and the old volume register, the counter having an output terminal supplying the volume to the old volume register and to the attenuator circuit controlling attenuation of the signal transmitted in the signal pathway.

6. A volume control system according to claim 1, wherein: the attenuator circuit further includes:
a digital volume attenuator and an analog volume attenuator.

7. A volume control system according to claim 1, further comprising:
a digital-to-analog converter (DAC) coupled between the digital signal processor and the attenuator in the signal pathway, the DAC converting a digital signal from the digital signal processor into an analog signal for attenuation by the attenuation circuit, wherein:
the attenuator circuit further includes a digital volume attenuator and an analog volume attenuator, the digital volume attenuator being coupled between the digital signal processor and the DAC in the signal pathway, and the analog volume attenuator being coupled subsequent to the DAC in the signal pathway.

8. A volume control system according to claim 1, further comprising:
a digital-to-analog converter (DAC) coupled between the digital signal processor and the attenuator in the signal pathway, the DAC converting a digital signal from the digital signal processor into an analog signal for attenuation by the attenuation circuit, wherein the attenuator circuit further includes:
a digital volume attenuator coupled between the digital signal processor and the DAC in the signal pathway, the digital volume attenuator having a control terminal coupled to the volume control circuit;
an analog volume attenuator coupled subsequent to the DAC in the signal pathway, the analog volume attenuator having a control terminal; and
a group delay having an input terminal coupled to the volume control circuit and an output terminal coupled to the control terminal of the analog volume attenuator.

9. A volume control system according to claim 1, further comprising:

an interpolation filter coupled to the digital signal processor in the signal pathway.

10. A volume control system according to claim 1, wherein:
the volume control circuit controls signal volume in a plurality of signal pathway channels.

11. An audio signal processor comprising:
a stereo analog-to-digital converter (ADC) coupled to a signal pathway;
a digital signal processor coupled to the stereo ADC in the signal pathway and including special-purpose functional processing logic operational upon a signal transmitted on the signal pathway, the special-purpose functional processing logic applying a gain to the signal; and
a stereo digital-to-analog converter (DAC) with volume control circuit coupled to the digital signal processor in the signal pathway, the stereo DAC with volume control circuit including:
a digital-to-analog converter (DAC) coupled to the digital signal processor in the signal pathway, the DAC converting a digital signal from the digital signal processor into an analog signal, the digital signal processor including a logic for executing a digital signal processing operation operational upon a signal transmitted on the signal pathway, the digital signal processing operating imposing a gain on the signal;
an attenuator circuit coupled to the digital signal processor in the signal pathway and having a control terminal, the attenuator circuit controlling attenuation of the signal transmitted in the signal pathway according to a control signal at the control terminal; and
a volume control circuit coupled to the digital signal processor and coupled to the attenuator circuit, the volume control circuit being coupled to receive a user volume signal and including a difference circuit for determining a difference between the gain and the user volume signal, a logic for determining an overall gain signal based on a maximum difference signal of the differences between gain and user volume in a plurality of signal channels, and a logic for determining a new volume signal based on the user volume minus the gain plus the overall gain signal, the new volume signal being coupled to the control terminal of the attenuator circuit and controlling the volume as the control signal.

12. An audio signal processor according to claim 11, further comprising:
a serial audio data interface coupled and supplying a user volume signal to the volume control circuit, the volume control circuit difference circuit determining a difference between the gain and the user volume signal.

13. An audio signal processor according to claim 11, wherein:
the digital signal processor special-purpose functional processing logic further includes a logic predicting a group delay in the signal pathway; and
the volume control circuit further includes a timing circuit timing the operation of the difference circuit.

14. An audio signal processor according to claim 11, wherein:
the volume control circuit includes:
a difference circuit coupled to the digital signal processor to receive the gain and coupled to a user volume control port, the difference circuit determining the difference between the gain and the user volume signal;

a new volume register coupled to the difference circuit and holding the difference as a new volume;

an old volume register;

a counter having a first input terminal coupled to the new volume register and having a second input terminal coupled to the old volume register, the counter decrementing or incrementing a volume depending on the relative amplitude of data in the new volume register and the old volume register, the counter having an output terminal supplying the volume to the old volume register and to the attenuator circuit controlling attenuation of the signal transmitted in the signal pathway.

15. An audio signal processor according to claim 11, wherein:

the attenuator circuit further includes:

a digital volume attenuator and an analog volume attenuator.

16. An audio signal processor according to claim 11, wherein:

the attenuator circuit further includes a digital volume attenuator and an analog volume attenuator, the digital volume attenuator being coupled between the digital signal processor and the DAC in the signal pathway, and the analog volume attenuator being coupled subsequent to the DAC in the signal pathway.

17. An audio signal processor according to claim 11, wherein the attenuator circuit further includes:

a digital volume attenuator coupled between the digital signal processor and the DAC in the signal pathway, the digital volume attenuator having a control terminal coupled to the volume control circuit;

an analog volume attenuator coupled subsequent to the DAC in the signal pathway, the analog volume attenuator having a control terminal; and a group delay having an input terminal coupled to the volume control circuit and an output terminal coupled to the control terminal of the analog volume attenuator.

18. An audio signal processor according to claim 11, further comprising:

an interpolation filter coupled to the digital signal processor in the signal pathway.

19. An audio signal processor according to claim 11, wherein:

the volume control circuit controls signal volume in a plurality of signal pathway channels.

20. A method of controlling volume in an audio system comprising:

executing a digital signal processing operation applied to an audio signal in a plurality of audio signal channels;

generating a digital signal processing gain signal for each channel of the plurality of audio signal channels;

receiving a user volume signal for each channel of the plurality of audio signal channels;

calculating a delta volume signal for each channel of the plurality of audio signal channels, the delta volume signal being equal to the digital signal processing gain signal minus the user volume signal for each channel of the audio signal channels;

determining an overall gain signal equal to the maximum delta volume signal for the plurality of audio signal channels and having a minimum delta value of zero;

determining a new volume signal for each channel of the plurality of audio signal channels, the new volume signal being equal to the user volume signal for a channel minus the digital signal processing gain signal for the channel plus the overall gain signal; and attenuating the audio signal for each channel of the plurality of channels as a function of the new volume signal.

21. A method according to claim 20 further comprising:

storing an old volume signal that was applied to attenuate the audio signal at a previous time; and decrementing or incrementing a volume control signal depending on the relative amplitude of the new volume signal and the old volume signal; and attenuating the audio signal for each channel of the plurality of channels as a function of the volume control signal.

22. A method according to claim 20 further comprising:

attenuating the audio signal as a function of the new volume signal in a digital attenuation step and an analog attenuation step.

23. A method according to claim 20 further comprising:

interpolating the audio signal prior to attenuating the audio signal.

24. A method according to claim 20 further comprising:

generating a digital signal processing delay signal for each channel of the plurality of audio signal channels; and inhibiting changes in the new volume signal under control of the digital signal processing delay signal.

25. A method according to claim 20 further comprising:

adjusting the slope of changes in the attenuation of audio signals to match the slope of changes in the digital signal processing gain signal.

26. A dynamic volume control system including a circuit for performing the method according to claim 20.

27. An electronic system including a microprocessor, a memory, a system bus and a dynamic volume control system including a circuit for performing the method according to claim 20.

28. A volume control system comprising:

a digital signal processor generating a digital signal processor gain;

a gain buffer coupled to the digital signal processor, the gain buffer storing a plurality of digital signal processor gain signals;

a user volume buffer storing a plurality of user volume signals;

a new volume decoder coupled to the gain buffer and coupled to the user volume buffer, the new volume decoder including a difference circuit determining a difference between a digital signal processor gain signal and a user volume signal;

a new volume register coupled to the new volume decoder, the new volume register holding the difference between a digital signal processor gain signal and a user volume signal; and an analog and digital volume decoder for decoding a volume signal as a function of the difference between a digital signal processor gain signal and a user volume signal, the volume signal controlling an audio signal in an audio signal path.

29. A volume control system according to claim 28 further comprising:

a digital signal processor gain delay counter coupled to the digital signal processor, the digital signal processor generating a digital signal processor delay; and a multiplexer having a first input terminal coupled to the new volume decoder and receiving the difference between a digital signal processor gain signal and a user volume signal, a second input terminal coupled to the new volume register and receiving a previous new volume signal, a third input terminal coupled to a mute signal, an output terminal coupled to the new volume register, and a control terminal coupled to the digital signal processor gain delay counter and determining a source for supplying the new volume register.

30. A volume control system according to claim 28 further comprising:

an old volume register; and an incrementing and decrementing counter having a first input terminal coupled to the new volume register, a second input terminal coupled to the old volume register, and an output terminal coupled to the old volume register and to the analog and digital volume decoder.

31. A volume control system according to claim 28 further comprising:

an old volume register;

a ramping speed circuit; and an incrementing and decrementing counter having a first input terminal coupled to the new volume register, a second input terminal coupled to the old volume register, an output terminal coupled to the old volume register and to the analog and digital volume decoder, and a control terminal coupled to the ramping speed circuit for controlling the ramping speed of the incrementing and decrementing counter.

32. An integrated circuit comprising:

a plurality of semiconductor devices implementing the volume control system according to claim 28.

33. A system comprising:

a volume control system including:
  a digital signal processor generating a digital signal processor gain;
  a gain buffer coupled to the digital signal processor, the gain buffer storing a plurality of digital signal processor gain signals;
  a user volume buffer storing a plurality of user volume signals;
  a new volume decoder coupled to the gain buffer and coupled to the user volume buffer, the new volume decoder including a difference circuit determining a difference between a digital signal processor gain signal and a user volume signal;
  a new volume register coupled to the new volume decoder, the new volume register holding the difference between a digital signal processor gain signal and a user volume signal; and
  an analog and digital volume decoder for decoding a volume signal as a function of the difference between a digital signal processor gain signal and a user volume signal, the volume signal controlling an audio signal in an audio signal path;

a control device coupled to the audio signal processor;

an audio input device coupled to the audio signal processor; and a sound production device coupled to the audio signal processor.

34. A system according to claim 33 wherein:

the system is an audio system;

the control device is a microcontroller;

the audio input device includes a multiplexer coupled to the audio signal processor and a plurality of audio input subdevices; and the sound production device is a speaker.

35. A system according to claim 34 wherein:

the plurality of audio input subdevices include subdevices selected from among a group including an AM radio receiver, an FM radio receiver, a cassette tape player, a compact disk player, and a minidisk player.

36. A system according to claim 33 wherein:

the system is a home theatre system;

the control device is a microcontroller;

the audio input device includes a multiplexer coupled to the audio signal processor and a plurality of audio input subdevices; and the sound production device is a speaker.

37. A system according to claim 33 wherein:

the system is an electronic musical instrument system;

the control device is a nonvolatile storage;

the audio input device includes a microphone; and the sound production device is a speaker.

38. A system comprising:

an audio signal processor including:
  a stereo analog-to-digital converter (ADC) coupled to a signal pathway;
  a digital signal processor coupled to the stereo ADC in the signal pathway and including special-purpose functional processing logic operational upon a signal transmitted on the signal pathway, the special-purpose functional processing logic applying a gain to the signal; and
  a stereo digital-to-analog converter (DAC) with volume control circuit coupled to the digital signal processor in the signal pathway, the stereo DAC with volume control circuit including:
    a digital-to-analog converter (DAC) coupled to the digital signal processor in the signal pathway, the DAC converting a digital signal from the digital signal processor into an analog signal, the digital signal processor including a logic for executing a digital signal processing operation operational upon a signal transmitted on the signal pathway, the digital signal processing operating imposing a gain on the signal;
    an attenuator circuit coupled to the digital signal processor in the signal pathway and having a control terminal, the attenuator circuit controlling attenuation of the signal transmitted in the signal pathway according to a control signal at the control terminal; and
    a volume control circuit coupled to the digital signal processor and coupled to the attenuator circuit, the volume control circuit being coupled to receive a user volume signal and including a difference circuit for determining a difference between the gain and the user volume signal, a logic for determining an overall gain signal based on a maximum difference signal of the differences between gain and user volume in a plurality of signal channels, and a logic for determining a new volume signal based on the user volume minus the gain plus the overall gain signal, the new volume signal being coupled to the control terminal of the attenuator circuit and controlling the volume as the control signal;

a control device coupled to the audio signal processor;

an audio input device coupled to the audio signal processor; and a sound production device coupled to the audio signal processor.

39. A system according to claim 38 wherein:

the system is an audio system;

the control device is a microcontroller;

the audio input device includes a multiplexer coupled to the audio signal processor and a plurality of audio input subdevices; and the sound production device is a speaker.

40. A system according to claim 39 wherein:

the plurality of audio input subdevices include subdevices selected from among a group including an AM radio receiver, an FM radio receiver, a cassette tape player, a compact disk player, and a minidisk player.

41. A system according to claim 38 wherein:

the system is a home theatre system;

the control device is a microcontroller;

the audio input device includes a multiplexer coupled to the audio signal processor and a plurality of audio input subdevices; and the sound production device is a speaker.

42. A system according to claim 38 wherein:

the system is an electronic musical instrument system;

the control device is a nonvolatile storage;

the audio input device includes a microphone; and the sound production device is a speaker.

\* \* \* \* \*